(12) United States Patent
Morikado

(10) Patent No.: US 7,750,404 B2
(45) Date of Patent: Jul. 6, 2010

(54) SEMICONDUCTOR DEVICE AND METHOD OF MANUFACTURING THE SAME

(75) Inventor: Mutsuo Morikado, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 236 days.

(21) Appl. No.: 11/843,337

(22) Filed: Aug. 22, 2007

(65) Prior Publication Data
US 2008/0048261 A1 Feb. 28, 2008

(30) Foreign Application Priority Data
Aug. 23, 2006 (JP) .............................. 2006-227110

(51) Int. Cl.
*H01L 27/01* (2006.01)
(52) U.S. Cl. ......................... 257/347; 257/350; 438/152
(58) Field of Classification Search ................. 257/347, 257/350; 438/152
See application file for complete search history.

(56) References Cited

U.S. PATENT DOCUMENTS 6,133,610 A * 10/2000 Bolam et al. ................ 257/349
6,355,511 B1 3/2002 Lukanc et al. ............... 438/152
6,632,710 B2 10/2003 Takahashi
2008/0048261 A1 * 2/2008 Morikado .................... 257/347

FOREIGN PATENT DOCUMENTS

JP 2000-243967 9/2000
JP 2002-190521 7/2002

* cited by examiner

*Primary Examiner*—Mark Prenty
(74) *Attorney, Agent, or Firm*—Oblon, Spivak, McClelland, Maier & Neustadt, L.L.P.

(57) ABSTRACT

According to an aspect of the present invention, there is provided a semiconductor device including an insulated gate field effect transistor including a gate electrode film formed, via a gate insulating film, on a semiconductor film formed on a support substrate via an insulating film, and a source region and drain region formed in the semiconductor film to sandwich the gate electrode film in a gate length direction, a support substrate contact including a polysilicon film formed on a first opening via a silicon oxide film, the first opening extending through the semiconductor film and the insulating film and reaching the support substrate, an interlayer dielectric film formed on the semiconductor film and the support substrate contact, and an interconnection connected to the polysilicon film via a conductive material, the conductive material filling a second opening, which extends through the interlayer dielectric film and reaches the support substrate contact.

16 Claims, 9 Drawing Sheets

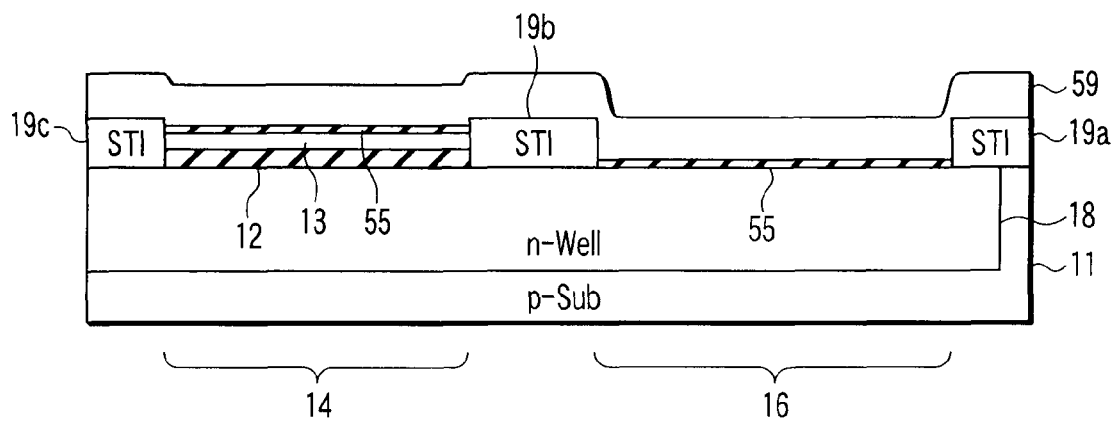
F I G. 8
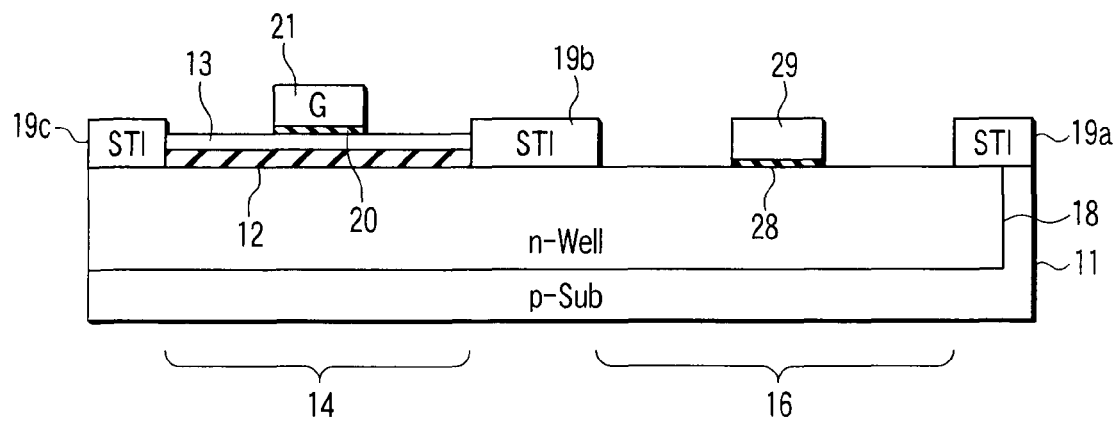
F I G. 9

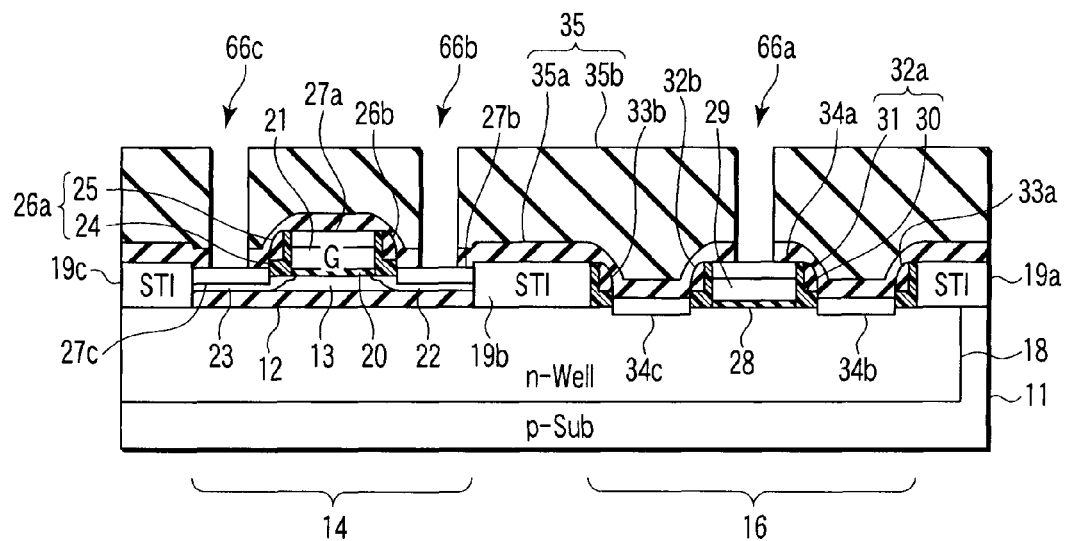
F I G. 12
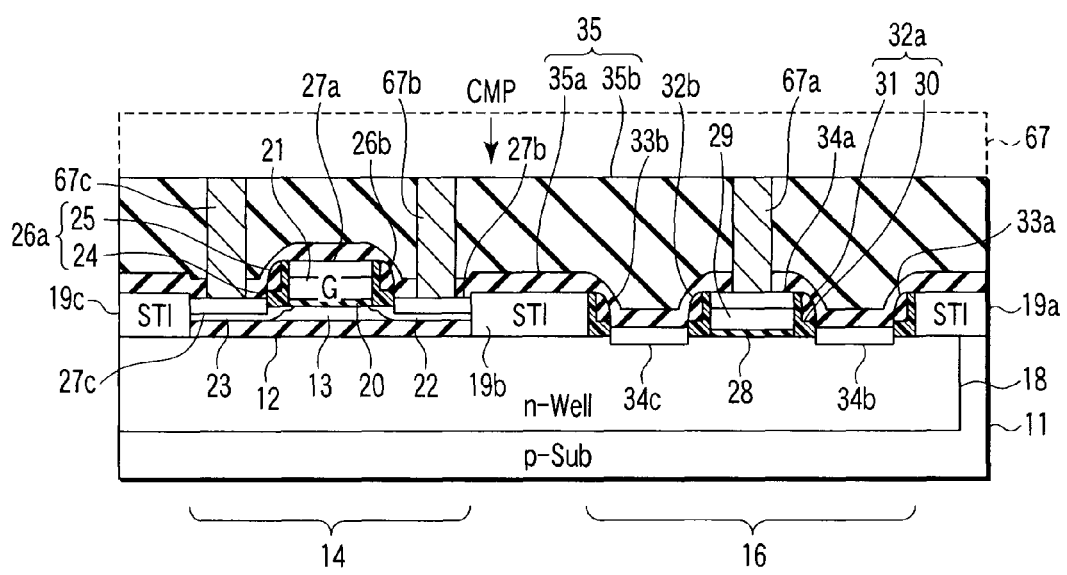
F I G. 13

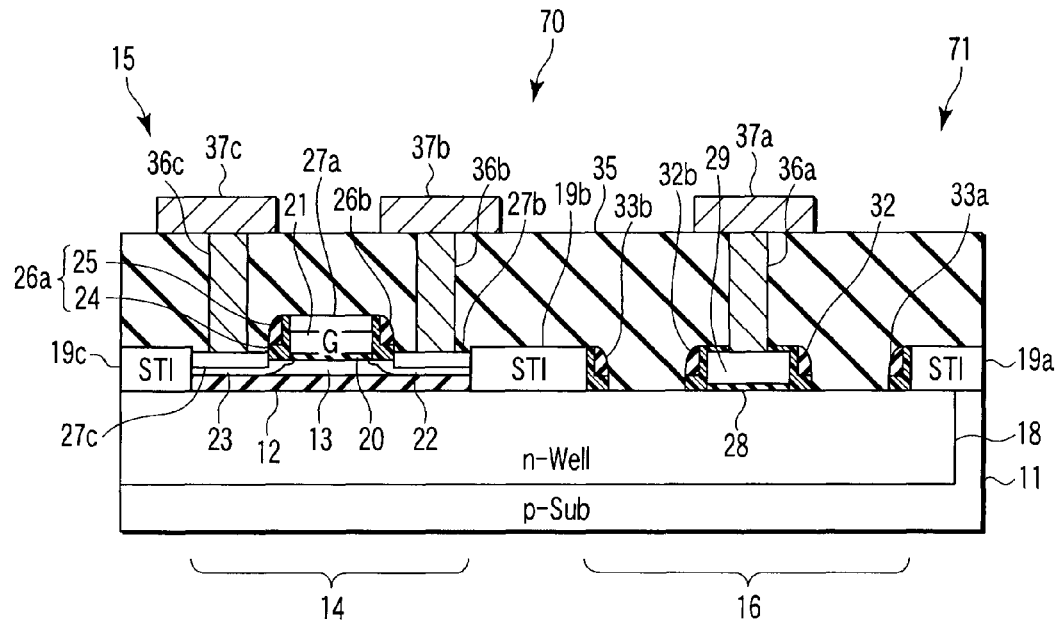
F I G. 14
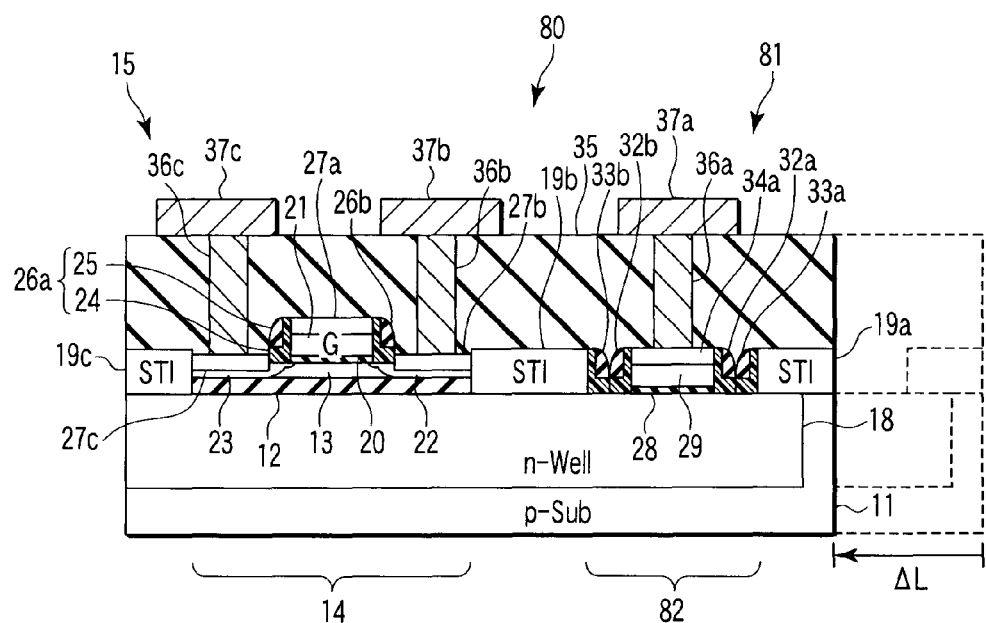
F I G. 15

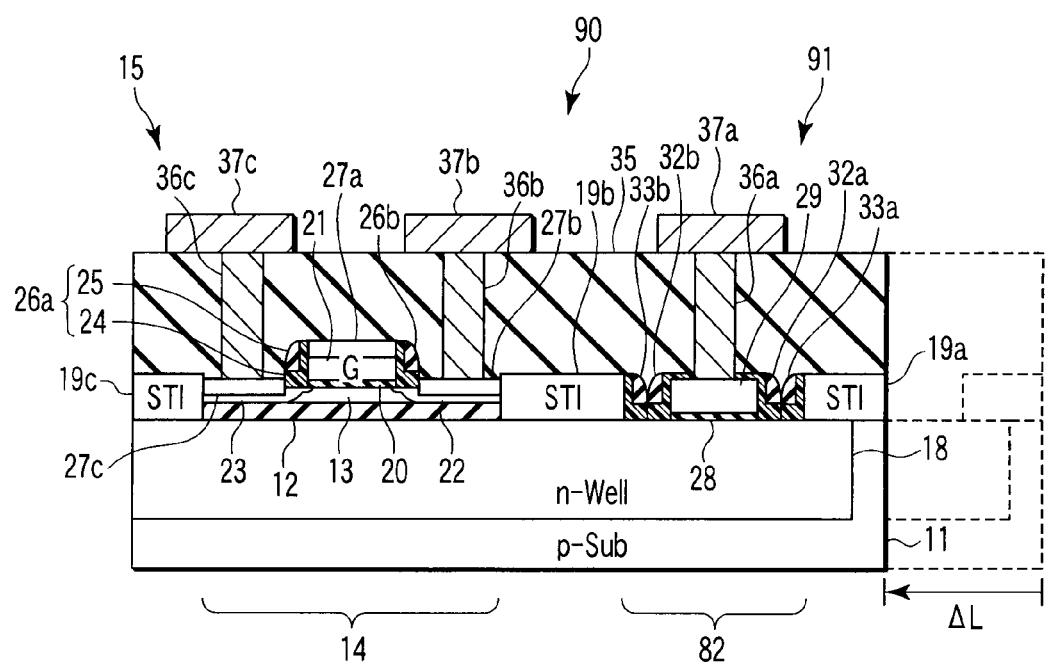
F I G. 16

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2006-227110, filed Aug. 23, 2006, the entire contents of which are incorporated herein by reference.

BACKGROUND OF THE INVENTION

1. Field of the Invention

The present invention relates to a semiconductor device and a method of manufacturing the same and, more particularly, to a semiconductor device having a substrate contact and a method of manufacturing the same.

2. Description of the Related Art

To meet the recent demands for a higher speed and lower power consumption of semiconductor devices, vigorous developments in semiconductor devices using a silicon-on-insulator (SOI) wafer are in progress. The SOI wafer has a thin semiconductor layer formed on a support substrate via an insulating layer called a buried oxidation (BOX) layer.

In the SOI wafer, the thin semiconductor layer of a transistor is always floating due to the presence of the insulating layer. Since the SOI wafer has advantages that, e.g., the parasitic capacitance of the transistor is low and complete element isolation is possible, its substrate structure is suitable for a higher speed and lower power consumption of semiconductor devices.

Unfortunately, the state in which the semiconductor layer is always floating makes the transistor susceptible to the substrate floating effect to result in the occurrence of the kink phenomenon and a decrease in drain breakdown voltage. To solve this problem, a contact from the thin semiconductor layer to the support substrate is formed to fix the potential of the support substrate itself, thereby suppressing potential fluctuation of the thin semiconductor layer (e.g., see Jpn. Pat. Appln. KOKAI Publication No. 2002-190521).

A semiconductor device manufacturing method disclosed in Jpn. Pat. Appln. KOKAI Publication No. 2002-190521 comprises steps of forming a first opening extending through an SOI layer and an insulating layer and reaching a substrate, burying polysilicon in the first opening to form a low-resistance plug layer by ion implantation, forming an interlayer dielectric film on the SOI layer and plug layer, and forming, in the interlayer dielectric film, a second opening reaching the plug layer.

With these steps, impurity ions are sufficiently implanted into the silicon substrate at the bottom of the substrate contact hole. In addition, a substrate contact hole and a contact hole of the transistor formed on the SOI layer, which have different depths, are formed at the same time.

However, the semiconductor device manufacturing method disclosed in Jpn. Pat. Appln. KOKAI Publication No. 2002-190521 increases the number of steps to form a plug layer. This may decrease the productivity to result in an increase in the manufacturing cost of a semiconductor device.

That is, this method requires a significantly higher manufacturing cost of an SOI substrate as compared with a bulk semiconductor substrate. To form a semiconductor device on the SOI substrate, it is necessary to decrease the manufacturing cost of the semiconductor device by simplifying the process involved as much as possible.

BRIEF SUMMARY OF THE INVENTION

According to an aspect of the present invention, there is provided a semiconductor device comprising: an insulated gate field effect transistor including a gate electrode film formed, via a gate insulating film, on a semiconductor film formed on a main surface of a support substrate via an insulating film, and a source region and drain region formed in the semiconductor film to sandwich the gate electrode film in a gate length direction; a support substrate contact including a polysilicon film formed on a first opening via a silicon oxide film, the first opening extending through the semiconductor film and the insulating film and reaching the support substrate; an interlayer dielectric film formed on the semiconductor film and the support substrate contact; and an interconnection connected to the polysilicon film via a conductive material, the conductive material filling a second opening, which extends through the interlayer dielectric film and reaches the support substrate contact.

According to another aspect of the present invention, there is provided a semiconductor device comprising: an insulated gate field effect transistor including a gate electrode film formed, via a gate insulating film, on a semiconductor film formed on a main surface of a support substrate via an insulating film, and a source region and drain region formed in the semiconductor film to sandwich the gate electrode film in a gate length direction, the insulated gate field effect transistor being disposed in a first region; a support substrate contact including a polysilicon film formed on a first opening via a silicon oxide film, the first opening extending through the semiconductor film and the insulating film and reaching the support substrate, and the support substrate contact being disposed in a second region; an STI formed on the main surface of the support substrate, the STI surrounding the first region, and the second region being positioned outside the STI; and an interconnection connected to the polysilicon film via a conductive material, the conductive material filling a second opening, which extends through the interlayer dielectric film and reaches the support substrate contact.

According to another aspect of the present invention, there is provided a semiconductor device manufacturing method comprising: forming, in a support substrate on which a semiconductor film is formed via an insulating film, a first opening extending through the semiconductor film and the insulating film and reaching the support substrate; forming a polysilicon film on the first opening via a silicon oxide film; forming a gate electrode film on the semiconductor film via a gate insulating film; forming a source region and drain region in the semiconductor film to sandwich the gate electrode film in a gate length direction; forming an interlayer dielectric film on the support substrate; forming a second opening reaching the polysilicon film in the interlayer dielectric film; and filling the second opening with a conductive material to form, on the interlayer dielectric film, an interconnection connected to the polysilicon film via the conductive material.

BRIEF DESCRIPTION OF THE SEVERAL VIEWS OF THE DRAWING

FIG. 8 is a sectional view sequentially showing semiconductor device manufacturing processing according to the first embodiment of the present invention;

FIG. 9 is a sectional view sequentially showing semiconductor device manufacturing processing according to the first embodiment of the present invention;

FIG. 12 is a sectional view sequentially showing semiconductor device manufacturing processing according to the first embodiment of the present invention;

FIG. 13 is a sectional view sequentially showing semiconductor device manufacturing processing according to the first embodiment of the present invention;

FIG. 14 is sectional view showing a semiconductor device according to the second embodiment of the present invention;

FIG. 15 is a sectional view showing a semiconductor device according to the third embodiment of the present invention; and FIG. 16 is a sectional view showing a semiconductor device according to the fourth embodiment of the present invention.

DETAILED DESCRIPTION OF THE INVENTION

Embodiments of the present invention will be described below with reference to the accompanying drawings.

Figure 1:
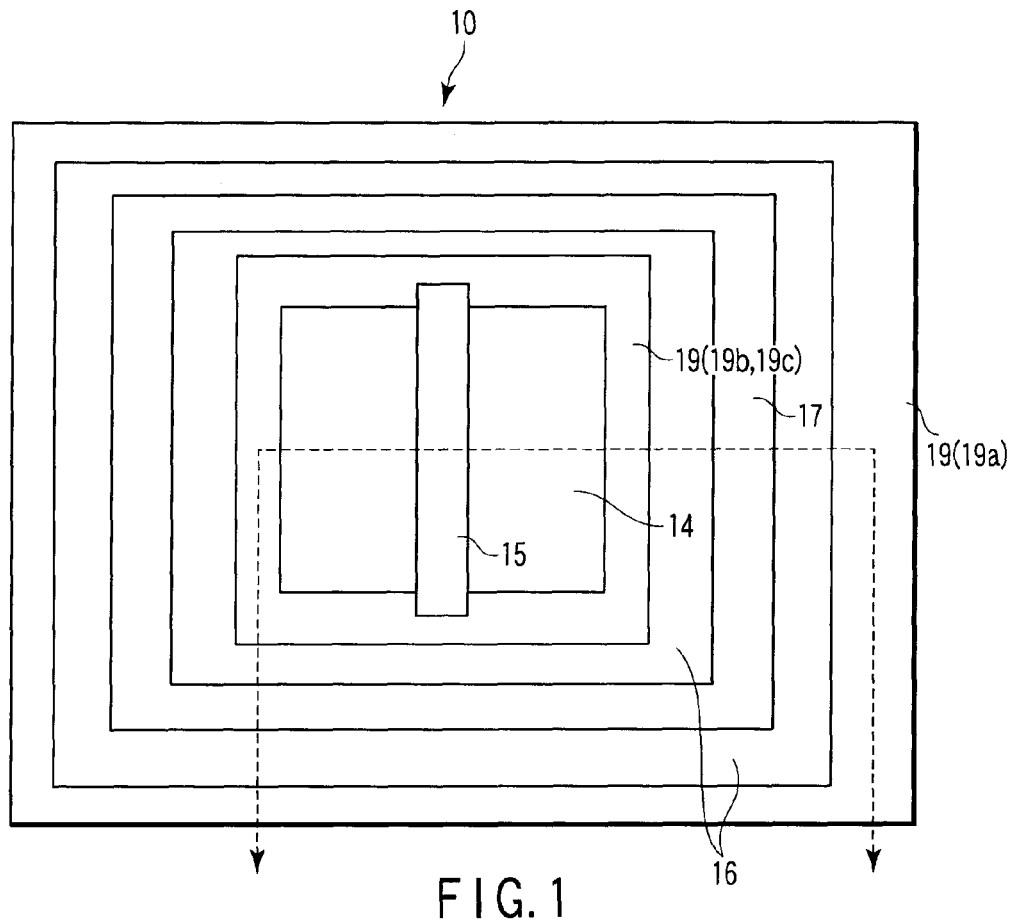
FIG. 1 is a schematic top view showing a semiconductor device according to the first embodiment of the present invention.
Figure 2:
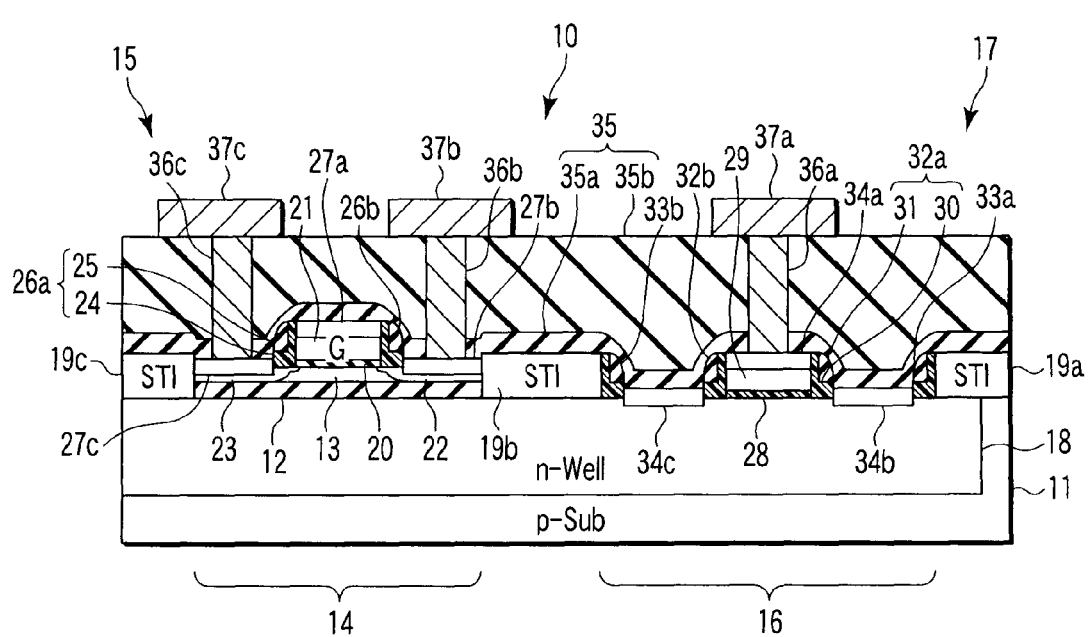
FIG. 2 is a sectional view showing the semiconductor device according to the first embodiment of the present invention.
Figure 3:
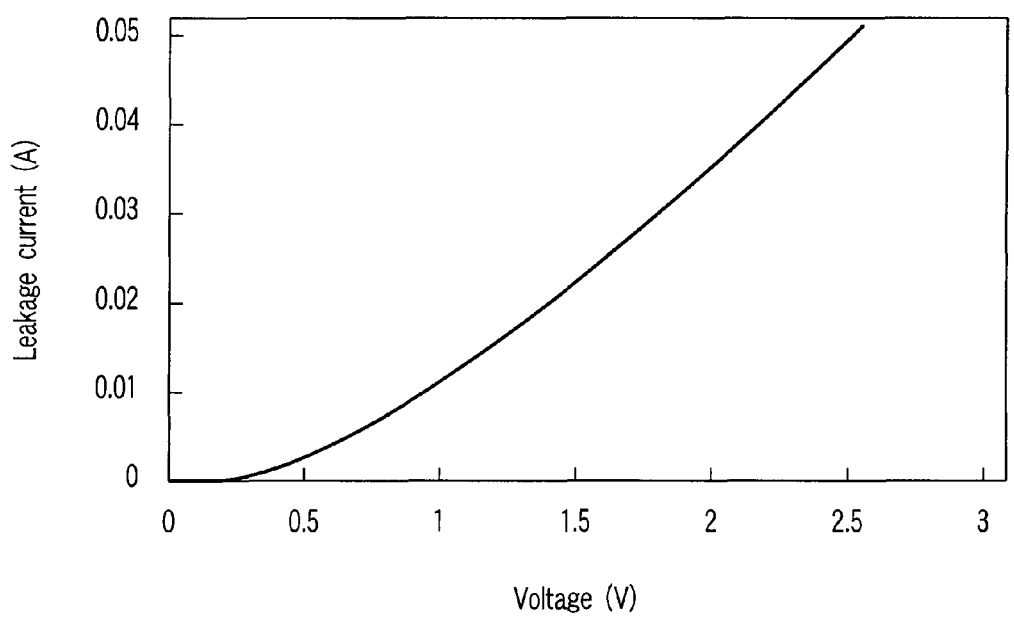
FIG. 3 is a graph showing the current-voltage characteristic of a support substrate contact according to the first embodiment of the present invention.

A semiconductor device and a method of manufacturing the same according to the first embodiment of the present invention will be explained with reference to FIGS. 1 to 13. FIG. 1 is a schematic top view showing a semiconductor device. FIG. 2 is a sectional view showing the semiconductor device. FIG. 3 is a graph showing the voltage-current characteristic of a support substrate contact of the semiconductor device. FIGS. 4 to 13 are sectional views sequentially showing semiconductor device manufacturing processing.

As shown in FIG. 1, in a semiconductor device 10 of the first embodiment, an STI 19 (19b, 19c in FIG. 2) is formed so as to surround a first region 14. A second region 16 is formed outside the STI 19 so as to surround the STI 19. Furthermore, an STI 19 (19a in FIG. 2) surrounds the second region 16.

An insulated gate field effect transistor (MOS transistor) 15 is formed in the first region 14. A support substrate contact 17 for fixing the potential of a support substrate 11 (described below) is formed in the second region 16. The support substrate contact 17 has a rectangular shape to surround the first region 14. It is desirable that the support substrate contact 17 is formed in a middle portion of the second region 16 so that the misalignment margin between the two STIs 19, 19 is maximized.

The channel length of the MOS transistor 15 is, for example, about 0.1 µm, and the channel width of that is, for example, about 2 to 3 µm. On the other hand, the width of the support substrate contact 17 is about 0.2 µm, and the total length of that is about 100 µm. Needless to say, the size of the MOS transistor 15 is not limited to the above size. The channel width of the MOS transistor 15 may be smaller than the above width. A plurality of MOS transistors 15 may be formed in the first region 14.

FIG. 2 is a sectional view along with an A-A line in FIG. 1. As shown in FIG. 2, there are the first region 14 and second region 16. The first region 14 includes a semiconductor film 13 formed on a support substrate 11 via an insulating film 12. The second region 16 surrounds the first region 14, and includes neither the insulating film 12 nor the semiconductor film 13. An n-type well region 18 is formed on the support substrate 11 over the range from the first region 14 to the second region 16.

An example of the support substrate 11 is a p-type silicon substrate. An example of the insulating film 12 is a 20-nm-thick silicon oxide film. An example of the semiconductor film 13 is a 55-nm-thick p-type silicon film. An example of the support substrate 11, insulating film 12, and semiconductor film 13 is a Separation by Implanted Oxygen (SIMOX) wafer manufactured in the following way. That is, oxygen ions are deeply implanted into a silicon substrate, and it is annealed at a high temperature to form an oxide film at a predetermined depth from the surface of the silicon substrate. In addition, any defects of the surface layer are removed.

Shallow trench isolations (STIs) 19a, 19b, and 19c separate the first region 14 and second region 16. The MOS transistor 15 is formed between the STIs 19b and 19c, while the contact 17 is formed between the STIs 19a and 19b.

The n-MOS transistor 15 formed in the first region 14 comprises a gate insulating film 20 formed on the semiconductor film 13, a silicon oxide film having a thickness of, e.g., 1.8 nm, a gate electrode film 21 formed on the gate insulating film 20, a polysilicon film having a thickness of, e.g., 175 nm, and a source region 22 and drain region 23 formed in the semiconductor film 13 to sandwich the gate electrode film 21 in the gate length direction.

The two side surfaces of the gate electrode film 21 are respectively covered with sidewall films 26a and 26b each of which is formed by stacking, e.g., a 20-nm-thick silicon oxide film 24 and a 70-nm-thick silicon nitride film 25. The maximum thickness of the sidewall films 26a and 26b, which is measured from the side surface of the gate electrode film, is 90 nm. Each of the silicon oxide films 24 of the sidewall films 26a and 26b contacts the gate electrode film 21 and the n-type well region 18. Owing to the structure, the silicon nitride film 25, which traps a large amount of charge, does not contact the gate electrode film 21 and n-type well region 18. Thereby, deterioration of the electric characteristic of the n-MOS transistor 15 can be prevented. Salicide films 27a, 27b, and 27c, e.g., cobalt salicide films are respectively formed on the gate electrode film 21, source region 22, and drain region 23.

The support substrate contact 17 formed in the second region 16 comprises a polysilicon film 29 formed via a silicon oxide film 28. The two side surfaces of the polysilicon film 29 are respectively covered with sidewall films 32a and 32b each of which is formed by stacking a silicon oxide film 30 and silicon nitride film 31.

A salicide film 34a is formed on the polysilicon film 29. Salicide films 34b and 34c are respectively formed between the STI 19a and the polysilicon film 29 and between the STI 19b and the polysilicon film 29. The silicon oxide film 28 is set to have the same thickness as that of the gate insulating film 20, while the polysilicon film 29 is set to have the same thickness and resistance value as those of the gate electrode film 21. Note that the upper surfaces of the salicide films 27b and 27c are lower than that of the salicide film 34a and higher than that of the silicon oxide film 28.

The silicon oxide film 30 is set to have the same thickness as that of the silicon oxide film 24, while the silicon nitride film 31 is set to have the same thickness as that of the silicon nitride film 25. The side surfaces of the STIs 19a and 19b on the side of the polysilicon film 29 are covered with sidewall films 33a and 33b equivalent to the sidewall films 32a and 32b.

The n-MOS transistor 15 and support substrate contact 17 are entirely covered with an interlayer dielectric film 35 having a silicon nitride film 35a and NSG (Non-doped Silicate Glass) film 35b. The polysilicon film 29 of the support substrate contact 17 connects to an interconnection 37a via a via 36a in which a contact hole extending through the interlayer dielectric film 35 is filled with a conductive material.

The source region 22 of the MOS transistor 15 connects to an interconnection 37b via a via 36b in which a contact hole extending through the interlayer dielectric film 35 is filled with a conductive material. The drain region 23 of the MOS transistor 15 connects to an interconnection 37c via a via 36c in which a contact hole extending through the interlayer dielectric film 35 is filled with a conductive material.

The polysilicon film 29 of the support substrate contact 17 is in contact with the n-type well region 18 via the silicon oxide film 28. When a voltage of a few volts is applied to the polysilicon film 29 as the fixed potential of the n-type well region 18 on the support substrate 11, the polysilicon film 29 electrically connects to the n-type well region 18 via the leakage current of the silicon oxide film 28. Hence, the support substrate contact 17 can play its original role.

Assume that the contact between the polysilicon film 29 and the n-type well region 18 had an area of 100 μm (width)× 1,000 μm (length), and a voltage was applied between the polysilicon film 29 and the n-type well region 18 via the 1.8-nm-thick silicon oxide film 28. As shown in FIG. 3, this experiment revealed that the current started rising from about 0.5 V and exhibited an almost linear relationship with a voltage of 1 V or more.

From this relationship, the on-resistance between the polysilicon film 29 and the n-type well region 18 was found to be 38 Ω or less, which was a sufficiently large value as a contact resistance for fixing the potential of the n-type well region 18 on the support substrate 11.

Even when the silicon oxide film 28 is present, the rectangular frame-shaped polysilicon film 29 surrounding the first region 14 can come into contact with the n-type well region 18 formed on the support substrate 11. When the thickness of the silicon oxide film 28 is changed to be larger than 2 nm, the leakage current of the silicon oxide film 28 drastically decreases to result in a rapid increase in contact resistance. In addition, the silicon oxide film 28 is set to have a thickness equal to that of the gate insulating film 20. Hence, the silicon oxide film 28 preferably has a thickness of 0 (exclusive) to 2 nm (inclusive).

On the other hand, the channel area of the MOS transistor is as small as 0.2 to 0.3 μm. Therefore, even when a voltage of 1 V is applied to the gate electrode film 21, its leakage current is as small as a few μAs. It does not affect the switching characteristic of the transistor.

A method of manufacturing the semiconductor device 10 will be explained next.

Figure 4:
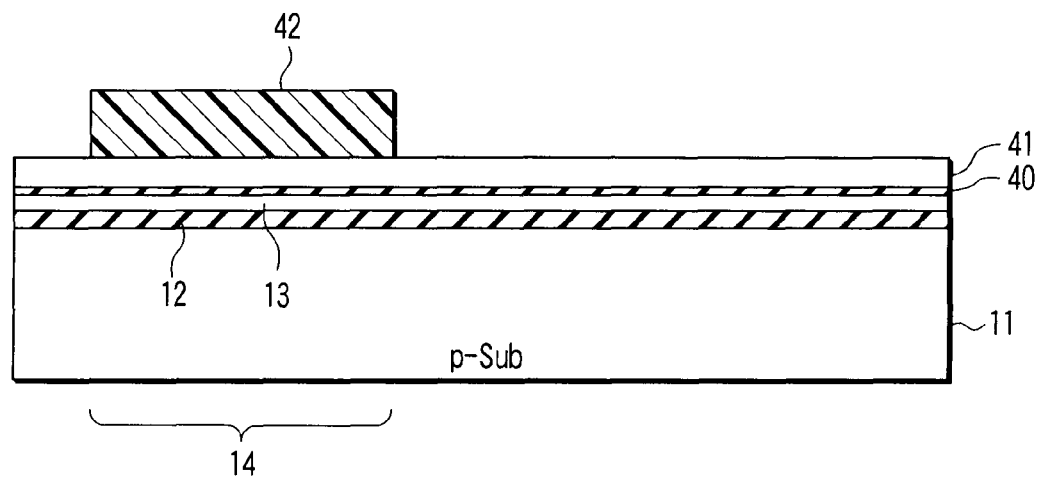
FIG. 4 is a sectional view sequentially showing semiconductor device manufacturing processing according to the first embodiment of the present invention.

First, as shown in FIG. 4, on a semiconductor film 13 about 55 nm thick formed on a support substrate 11 via an insulating film 12 about 20 nm thick, a silicon oxide film 40 about 4 nm thick and a silicon nitride film 41 about 100 nm thick are formed by thermal oxidation and plasma chemical vapor deposition (PCVD), respectively.

Next, a resist film 42 for forming a first region 14 is formed on the silicon nitride film 41 by photolithography.

Figure 5:
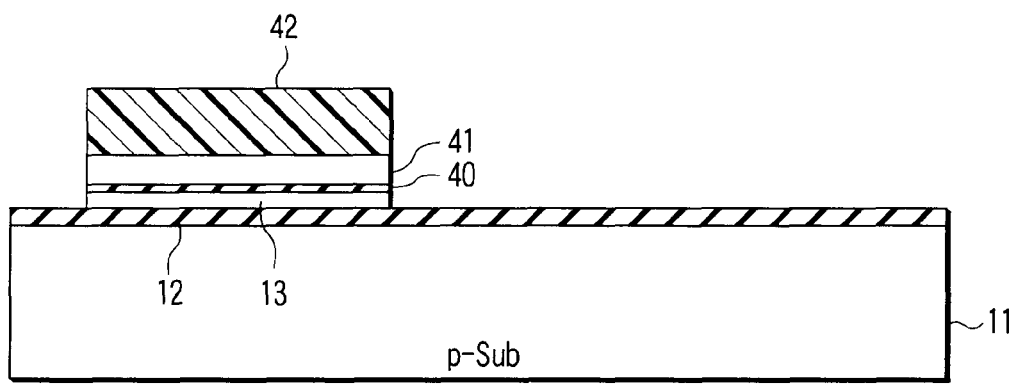
FIG. 5 is a sectional view sequentially showing semiconductor device manufacturing processing according to the first embodiment of the present invention.

As shown in FIG. 5, using the resist film 42 as a mask, the silicon nitride film 41, silicon oxide film 40, and semiconductor film 13 are sequentially etched by, e.g., reactive ion etching (RIE) to expose the insulating film 12 except the first region 14.

Figure 6:
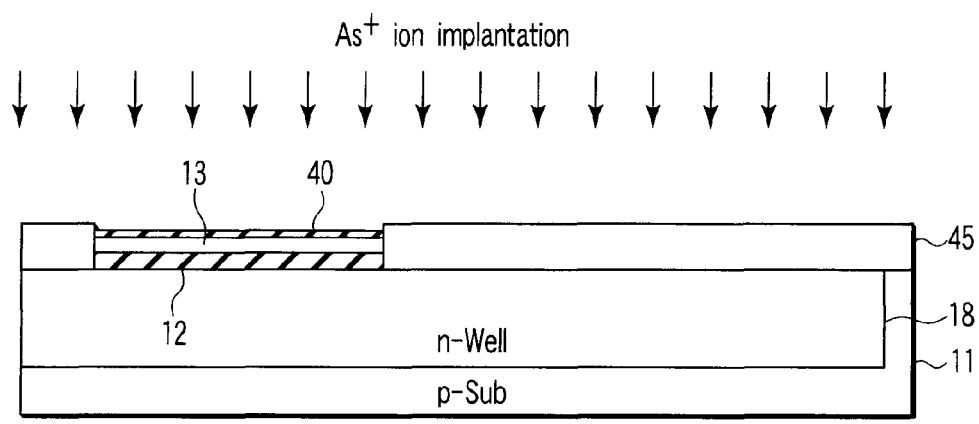
FIG. 6 is a sectional view sequentially showing semiconductor device manufacturing processing according to the first embodiment of the present invention.

After removing the resist film 42, as shown in FIG. 6, a tetraethyl-orthosilicate (TEOS) film 45 is formed on the exposed insulating film 12, and an n-type well region 18 is formed on the support substrate 11. More specifically, a TEOS film 45 about 450 nm thick is formed on the exposed insulating film 12 and the remaining silicon nitride film 41 by, e.g., high-density plasma (HDP).

The TEOS film 45 is removed by chemical mechanical polishing (CMP) to expose the silicon nitride film 41. The silicon nitride film 41 is etched and removed.

Arsenic ions (As+) are implanted into the support substrate 11 by ion implantation through the silicon oxide film 40, semiconductor film 13, insulating film 12, and TEOS film 45. The support substrate 11 undergoes activation annealing to form the n-type well region 18.

Figure 7:
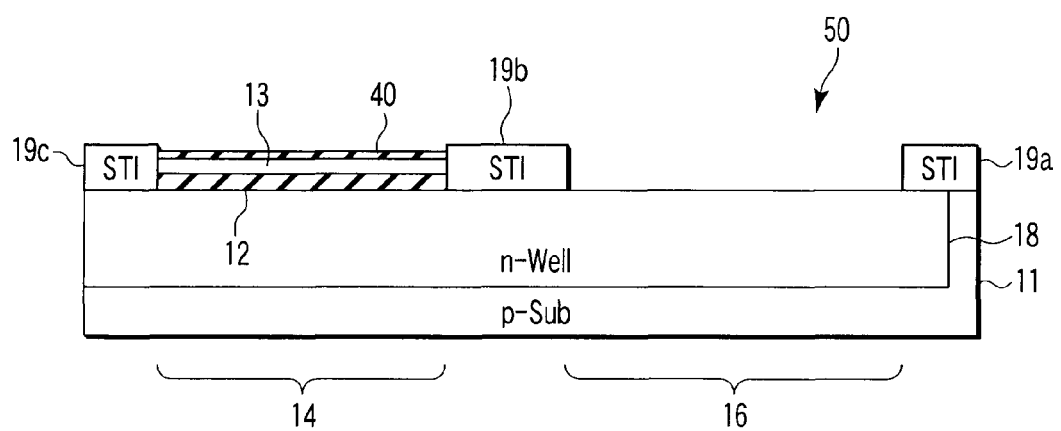
FIG. 7 is a sectional view sequentially showing semiconductor device manufacturing processing according to the first embodiment of the present invention.

As shown in FIG. 7, a first opening 50 for forming a support substrate contact 17 is formed to form STIs 19a, 19b, and 19c. More specifically, a first resist film (not shown) having the opening pattern of a second region 16 is formed on the semiconductor film 13. Using the first resist film as a mask, the TEOS film 45 and insulating film 12 are etched by RIE using a CF4-based gas to expose the n-type well region 18. The first opening 50 for forming the support substrate contact 17 is thus formed. At the same time, the remaining TEOS film 45 forms the STIs 19a, 19b, and 19c.

After removing the first resist film and the silicon oxide film 40 in the first region 14, as shown in FIG. 8, 1.8-nm-thick silicon oxide films 55 are formed on the semiconductor film 13 and the exposed n-type well region 18 by thermal oxidation. The silicon oxide films 55 become a gate insulating film 20 and silicon oxide film 28. In consequence, the gate insulating film 20 is not damaged from implantation when forming the n-type well region 18, thereby preventing deterioration of the characteristic of the MOS transistor.

The surface layers of the silicon oxide films 55 are nitrided using NO gas to form a 175-nm-thick polysilicon film 59 by CVD. The polysilicon film 59 becomes a gate electrode film 21 and polysilicon film 29.

As shown in FIG. 9, a second resist film (not shown) having the patterns of the gate and support substrate contact is formed on the polysilicon film 59. Using the second resist film as a mask, the polysilicon film 59 is etched by RIE.

With this processing, in the first region 14, the gate electrode film 21 is formed on the semiconductor film 13 via the gate insulating film 20. In the second region 16, the polysilicon film 29 is formed on the n-type well region 18 on the support substrate 11 via the silicon oxide film 28.

Figure 10:
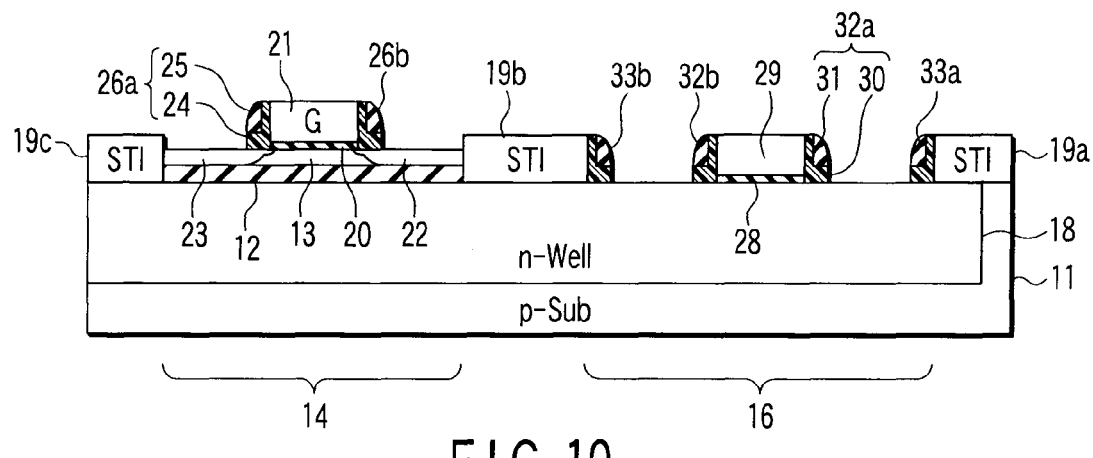
FIG. 10 is a sectional view sequentially showing semiconductor device manufacturing processing according to the first embodiment of the present invention.

After removing the second resist film, as shown in FIG. 10, a source region 22 and drain region 23 having a lightly doped drain (LDD) structure, which are formed in the semiconductor film 13 by ion implantation, and sidewall films 26a and 26b each of which is formed by stacking the silicon oxide film 24 and silicon nitride film 25 on the sidewalls of the gate electrode film 21 are formed to sandwich the gate electrode film 21 in the gate length direction.

More specifically, 2 nm-thick silicon oxide films (not shown) are formed on the semiconductor film 13, on the upper surface and sidewalls of the gate electrode film 21, and on the upper surface and sidewalls of the polysilicon film 29 by thermal oxidation.

A lightly doped impurity region (not shown) having the LDD structure is formed in the semiconductor film 13 by ion implantation to sandwich the gate electrode film 21 in the gate length direction.

A 20-nm-thick TEOS film (not shown) and a 70-nm-thick silicon nitride film (not shown) are formed on the entire surface of the support substrate 11 by CVD and PCVD, respectively. The TEOS film becomes the silicon oxide films 24 and 30, while the silicon nitride film becomes the silicon nitride films 25 and 31.

Except the sidewalls of the gate electrode film 21 and polysilicon film 29, the silicon nitride film and TEOS film are etched by RIE to form the sidewall films 26a, 26b, 32a, 32b, 33a, and 33b so that a total thickness of each of them, which is the length from the side surface of the gate electrode film 21 and 29 to the surface of the most projected portion of the gate electrode film 21 and 29, is 90 nm.

That is, while sidewall films 26a and 26b are formed, the sidewall films 32a and 32b are formed by stacking a silicon oxide film 30 and silicon nitride film 31 on the sidewalls of the polysilicon film 29. The sidewall films 33a and 33b are formed by stacking a silicon oxide film 30 and silicon nitride film 31 on the sidewalls of the STIs 19a and 19b on the side of the polysilicon film 29.

A heavily doped impurity region (not shown) having the LDD structure is formed in the semiconductor film 13 by ion implantation to sandwich the gate electrode film 21 in the gate length direction to form the source region 22 and drain region 23.

Figure 11:
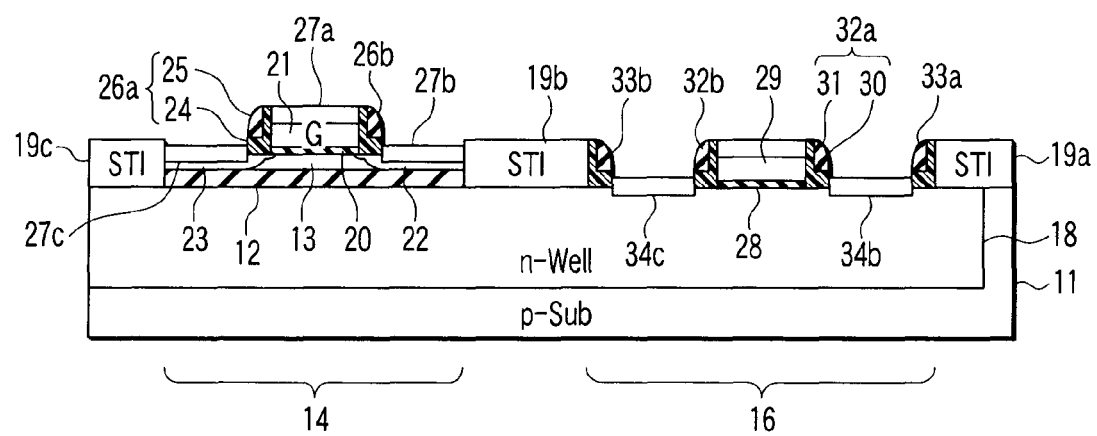
FIG. 11 is a sectional view sequentially showing semiconductor device manufacturing processing according to the first embodiment of the present invention.

As shown in FIG. 11, low-resistance cobalt silicide ($CoSi_2$) films 27a, 27b, 27c, 34a, 34b, and 34c are formed on the gate electrode film 21, the source region 22, the drain region 23, the polysilicon film 29, and the n-type well region 18 between the polysilicon film 29 and the STIs 19a and 19b, respectively.

More specifically, a 12-nm-thick cobalt (Co) film, a 20-nm-thick titanium (Ti) film, and a 20-nm-thick titanium nitride (TiN) film are formed on the entire surface of the support substrate 11 in the order named. The support substrate 11 is then annealed. After removing the unreacted cobalt (Co) film, titanium (Ti) film, and titanium nitride (TiN) film by wet etching, the support substrate 11 is annealed again.

As shown in FIG. 12, a 30-nm-thick silicon nitride film 35a and a 400-nm-thick non-doped silicate glass (NSG) film 35b are formed on the entire surface of the support substrate 11 as an interlayer dielectric film 35 by PCVD and CVD, respectively. The upper surface of the interlayer dielectric film 35 is planarized by CMP to form contact holes 66a, 66b, and 66c in the interlayer dielectric film 35 by RIE.

Note that the depth of the contact hole 66a, which is measured from the upper surface of the interlayer dielectric film 35, is different from those of the contact holes 66b and 66c, resulting in difficulty in controlling the etching condition. However, the upper surface of the salicide film 34a is higher than those of the silicide films 27b and 27c. Therefore, by making the depth of the contact holes 66a agree with those of the contact holes 66b and 66c, poor contact of the support substrate contact 17 is prevented. In addition, since the source region 22 and drain region 23 are not over-etched when etching the contact holes 66b and 66c, poor contact with the source region 22 and drain region 23 are prevented.

As shown in FIG. 13, titanium (Ti)/titanium nitride (TiN)/tungsten (W) are formed on the interlayer dielectric film 35, including the contact holes 66a, 66b, and 66c, as a conductive material portion 67 in the order named by sputtering. Any unnecessary conductive material portion 67 is removed by CMP to fill the contact holes 66a, 66b, and 66c with conductive material portions 67a, 67b, and 67c.

A 250-nm-thick interlayer dielectric film (not shown) is formed on the interlayer dielectric film 35 to form interconnections 37a, 37b, and 37c, e.g., copper (Cu) interconnections by damacine. With this processing, a semiconductor device 10 is obtained in which the MOS transistor 15 is formed in the first region 14 shown in FIG. 2, while the support substrate contact 17 is formed in the second region 16 surrounding the first region 14.

As has been described above, according to the first embodiment, the gate insulating film 20 of the MOS transistor 15 and the silicon oxide film 28 of the support substrate contact 17 are formed by the same process, while the gate electrode film 21 of the MOS transistor 15 and the polysilicon film 29 of the support substrate contact 17 are formed by the same process.

The contact between the n-type well region 18 and the rectangular frame-shaped polysilicon film 29 surrounding the first region 14 is set to have a sufficiently large area. Even when the silicon oxide film 28 is present, the polysilicon film 29 can come into contact with the n-type well region 18 via the leakage current of the silicon oxide film 28.

This makes it possible to obtain a semiconductor device and semiconductor device manufacturing method capable of forming a contact with the support substrate 11 by a relatively small number of steps.

The case wherein the support substrate 11, insulating film 12, and semiconductor film 13 are SIMOX wafers has been exemplified. However, there is also available a bonded substrate formed by bonding two silicon substrates via an oxide film and polishing one silicon substrate into a thin film.

The case wherein the support substrate 11 is a p-type silicon substrate has also been exemplified. However, there is also available a silicon germanium (SiGe) substrate, a germanium (Ge) substrate, or a semiconductor substrate made of some other compound.

The case wherein the gate insulating film 20 is a silicon oxide film has also been exemplified. However, there is also available a film having a higher permittivity than a silicon oxide film, such as a silicon oxynitride (SiON) film, hafnium oxide ($HfO_2$) film, hafnium silicon oxide (HfSiO) film, hafnium silicon oxynitride (HfSiON) film, hafnium aluminum oxide (HfAlO) film, or hafnium aluminum oxynitride (HfAlON) film.

A hafnium silicon oxynitride (HfSiON) film can be formed in the following way. For example, a hafnium silicon oxide ($HfSiO_4$) film is formed on the p-type silicon substrate 11 by MOCVD. After that, the p-type silicon substrate 11 is annealed in an ammonia ($NH_3$) or a nitrogen plasma atmosphere.

FIG. 14 is a sectional view showing a semiconductor device according to the second embodiment of the present invention. The same reference numbers as in the first embodiment denote the same constituent parts in the second embodiment, and a description thereof will be omitted. Only different parts will be described below.

The second embodiment is different from the first embodiment in that no salicide film is formed on a support substrate contact.

The second embodiment will exemplify a semiconductor device in which no salicide film can be formed on the entire chip surface. An example is a semiconductor device having a resistive element and an RC delay circuit which, if a salicide film is formed on the resistive element, cannot satisfy the standard because the resistance value becomes too low.

That is, as shown in FIG. 14, in a support substrate contact 71 of a semiconductor device 70 according to the second embodiment, no salicide films are formed on a polysilicon film 29 and an n-type well region 18 exposed between the polysilicon film 29 and each of STIs 19a and 19b. The polysilicon film 29 directly connects to an interconnection 37a via a via 36a.

The contact characteristic between the polysilicon film 29 and a conductive material portion 67a of the via 36a slightly increases due to the absence of a salicide film 34a. However, this contact characteristic is far better than that between the polysilicon film 29 and the n-type well region 18 via a silicon oxide film 28. Hence, the support substrate contact 71 can satisfy a necessary contact characteristic.

This makes it possible to, in a semiconductor device in which no salicide film can be formed on the entire chip surface, bring the support substrate contact 71 into contact with a region where no salicide film can be formed.

As has been described above, the second embodiment has a merit that it can form the support substrate contact 71 in a region where no salicide film can be formed, without increasing the number of steps.

FIG. 15 is a sectional view showing a semiconductor device according to the third embodiment of the present invention. The same reference numbers as in the first embodiment denote the same constituent parts in the third embodiment, and a description thereof will be omitted. Only different parts will be described below.

The third embodiment is different from the first embodiment in that a second region in which a support substrate contact is formed is reduced.

That is, as shown in FIG. 15, in a support substrate contact 81 of a semiconductor device 80 according to the third embodiment, an n-type well region 18 is not exposed around a polysilicon film 29. A sidewall film 32a of the polysilicon film 29 and a sidewall film 33a of an STI 19a are integrated, while a sidewall film 32b of the polysilicon film 29 and a sidewall film 33b of an STI 19b are integrated.

Since the width of a second region 82 in which the support substrate contact 81 is formed decreases by ΔL, it is possible to reduce the chip size of the semiconductor device 80.

As has been described above, the third embodiment has an advantage that it can reduce the chip size of the semiconductor device 80 by decreasing the width of the second region 82 without exposing the n-type well region 18 around the polysilicon film 29 in the region outside the second region 82.

In addition, the width of the second region 82 can be reduced from that shown in FIG. 15. In this case, the regions between the polysilicon film 29 and the STIs 19a and 19b are filled with the silicon oxide film 30 only. In consequence, the sidewall films 32a, 32b, 33a, and 33b are formed with the silicon oxide film 30 only.

FIG. 16 is a sectional view showing a semiconductor device according to the fourth embodiment of the present invention. The same reference numbers as in the fourth embodiment denote the same constituent parts in the fourth embodiment, and a description thereof will be omitted. Only different parts will be described below.

The fourth embodiment is different from the first embodiment in that no salicide film is formed on a support substrate contact, and in that the width of a second region in which the support substrate contact is formed is decreased.

That is, as shown in FIG. 16, in a support substrate contact 91 of a semiconductor device 90 according to the fourth embodiment, no salicide film is formed on a polysilicon film 29. The polysilicon film 29 directly connects to an interconnection 37a via a via 36a.

As has been described above, the fourth embodiment has an advantage that it can reduce the chip size of a semiconductor device 80 and forming a support substrate contact 71 in a region where no salicide film can be formed, without increasing the number of steps.

According to the embodiments of the present invention, it is possible to obtain a semiconductor device capable of forming a sufficient contact with a support substrate by a relatively small number of steps.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   an insulated gate field effect transistor including a gate electrode film formed, via a gate insulating film, on a semiconductor film formed on a main surface of a support substrate via an insulating film, and a source region and drain region formed in the semiconductor film to sandwich the gate electrode film in a gate length direction;
   a support substrate contact including a polysilicon film formed on a first opening via a silicon oxide film, the first opening extending through the semiconductor film and the insulating film and reaching the support substrate;
   an interlayer dielectric film formed on the semiconductor film and the support substrate contact; and
   an interconnection connected to the polysilicon film via a conductive material, the conductive material filling a second opening, which extends through the interlayer dielectric film and reaches the support substrate contact, wherein
   the silicon oxide film is equal to the gate insulating film in thickness, the support substrate contact surrounds the insulated gate field effect transistor, and the polysilicon film is equal to the gate electrode film in thickness.

2. A semiconductor device comprising:
   an insulated gate field effect transistor including a gate electrode film formed, via a gate insulating film, on a semiconductor film formed on a main surface of a support substrate via an insulating film, and a source region and drain region formed in the semiconductor film to sandwich the gate electrode film in a gate length direction, the insulated gate field effect transistor being disposed in a first region;
   a support substrate contact including a polysilicon film formed on a first opening via a silicon oxide film, the first opening extending through the semiconductor film and the insulating film and reaching the support substrate, and the support substrate contact being disposed in a second region;
   an STI formed on the main surface of the support substrate, the STI surrounding the first region, and the second region being positioned outside the STI; and an interconnection connected to the polysilicon film via a conductive material, the conductive material filling a second opening, which extends through an interlayer dielectric film and reaches the support substrate contact, wherein the silicon oxide film is equal to the gate insulating film in thickness, the support substrate contact surrounds the insulated gate field effect transistor, and the polysilicon film is equal to the gate electrode film in thickness.

3. A semiconductor device manufacturing method comprising:

forming, in a support substrate on which a semiconductor film is formed via an insulating film, a first opening extending through the semiconductor film and the insulating film and reaching the support substrate;

forming a polysilicon film on the first opening via a silicon oxide film to form a support substrate contact;

forming a gate electrode film on the semiconductor film via a gate insulating film;

forming a source region and drain region in the semiconductor film to sandwich the gate electrode film in a gate length direction;

forming an interlayer dielectric film on the support substrate;

forming a second opening reaching the polysilicon film in the interlayer dielectric film; and filling the second opening with a conductive material to form, on the interlayer dielectric film, an interconnection connected to the polysilicon film via the conductive material, wherein the silicon oxide film is equal to the gate insulating film in thickness, and the support substrate contact surrounds an insulated gate field effect transistor including the gate electrode film and the source region and drain region in the semiconductor film, and the polysilicon film is equal to the gate electrode film in thickness.

4. The device according to claim 1, wherein a salicide film is formed on the polysilicon film.

5. The device according to claim 1, wherein upper surfaces of the source region and drain region are lower than that of the support substrate contact and higher than that of the silicon oxide film.

6. The device according to claim 4, wherein a salicide film is formed at a periphery of the first opening while being spaced apart from the support substrate contact.

7. The device according to claim 1, wherein the silicon oxide film has a thickness of 0(exclusive) to 2 nm (inclusive).

8. The device according to claim 1, wherein an area of a region of the polysilicon film which comes into contact with the silicon oxide film is larger than an area of a region of the gate electrode film which comes into contact with the gate insulating film.

9. The device according to claim 2, wherein a well region is formed under the insulating film and under the support substrate contact.

10. The device according to claim 2, further comprising:

a first sidewall film formed on a sidewall of the polysilicon film; and a second sidewall film formed on a sidewall of the STI on the side of the polysilicon film;

wherein the first sidewall film and the second sidewall film are integrated.

11. The device according to claim 2, wherein a salicide film is formed on the polysilicon film.

12. The device according to claim 2, wherein upper surfaces of the source region and drain region are lower than that of the support substrate contact and higher than that of the silicon oxide film.

13. The device according to claim 11, wherein a salicide film is formed at a periphery of the first opening while being spaced apart from the support substrate contact.

14. The device according to claim 2, wherein the silicon oxide film has a thickness of 0(exclusive) to 2 nm (inclusive).

15. The device according to claim 2, wherein an area of a region of the polysilicon film which comes into contact with the silicon oxide film is larger than an area of a region of the gate electrode film which comes into contact with the gate insulating film.

16. The method according to claim 3, wherein a salicide film is formed on the polysilicon film.

* * * * *